(12) United States Patent
Han et al.

(10) Patent No.: US 12,720,975 B2
(45) Date of Patent: Aug. 25, 2026

(54) DISPLAY DEVICE AND TILING DISPLAY APPARATUS INCLUDING THE DISPLAY DEVICE

(71) Applicant: LG DISPLAY CO., LTD., Seoul (KR)

(72) Inventors: Jisu Han, Seoul (KR); Won-Gyu Jeong, Gyeonggi-do (KR); Joong-Ha Lee, Gyeonggi-do (KR); Da-Young Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 459 days.

(21) Appl. No.: 18/383,685

(22) Filed: Oct. 25, 2023

(65) Prior Publication Data

US 2024/0172495 A1 May 23, 2024

(30) Foreign Application Priority Data

Nov. 21, 2022 (KR) ........................ 10-2022-0156617

(51) Int. Cl.
*H10K 59/127* (2023.01)
*H10K 59/80* (2023.01)

(52) U.S. Cl.
CPC ....... *H10K 59/1275* (2023.02); *H10K 59/805* (2023.02); *H10K 59/8722* (2023.02)

(58) Field of Classification Search
CPC . H10W 90/00; H10K 59/8722; H10K 59/805; H10K 59/18; H10K 59/131; H10K 59/1275; H10H 29/142; H10H 29/10; H10H 20/855; H10H 20/854; H10H 20/853; H10D 86/451; H10D 86/441; G09F 9/33; G09F 9/3026; G09F 9/3023; G09F 9/301
See application file for complete search history.

(56) References Cited

U.S. PATENT DOCUMENTS

| | | | | |
|---|---|---|---|---|
| 12,525,592 | B2 * | 1/2026 | Choi | H10H 20/857 |
| 2013/0171371 | A1 | 7/2013 | Toyama et al. | |
| 2018/0188579 | A1 | 7/2018 | Jeong et al. | |
| 2021/0202449 | A1 | 7/2021 | Shin et al. | |
| 2021/0202630 | A1 * | 7/2021 | Jeon | H10K 59/131 |
| 2021/0202906 | A1 * | 7/2021 | Kim | G09G 3/3266 |
| 2022/0199594 | A1 | 6/2022 | Shin et al. | |
| 2022/0320056 | A1 * | 10/2022 | Liang | H10W 90/00 |
| 2023/0005962 | A1 | 1/2023 | Lee et al. | |
| 2024/0290919 | A1 * | 8/2024 | Choi | H10D 86/441 |
| 2025/0275362 | A1 * | 8/2025 | Cha | H10K 59/1213 |

FOREIGN PATENT DOCUMENTS

| | | |
|---|---|---|
| KR | 10-2013-0014070 A | 2/2013 |
| KR | 10-2021-0063010 A | 6/2021 |
| KR | 10-2021-0083875 A | 7/2021 |
| KR | 10-2021-0086281 A | 7/2021 |
| KR | 10-2022-0091278 A | 6/2022 |

* cited by examiner

*Primary Examiner* — Dao H Nguyen
(74) *Attorney, Agent, or Firm* — Fish & Richardson P.C.

(57) ABSTRACT

A display device includes a first substrate on which a plurality of light-emitting elements are disposed; an optical film including an upper surface, a side surface and a lower surface, and disposed on one surface of the first substrate and; a second substrate bonded to another surface of the first substrate; a side surface line electrically connecting the first substrate and the second substrate with each other; a side surface sealing member covering the side surface line; and a conductive protective film covering the side surface sealing member and the optical film.

25 Claims, 10 Drawing Sheets

DISPLAY DEVICE AND TILING DISPLAY APPARATUS INCLUDING THE DISPLAY DEVICE

CROSS-REFERENCE TO RELATED APPLICATION

This application claims the priority of Korean Patent Application No. 10-2022-0156617 filed on Nov. 21, 2022, which is hereby are herein incorporated by reference in its entirety.

BACKGROUND

Field of the Disclosure

The present disclosure relates to a display device, and more particularly, to a display device including a side surface protective structure to protect a side surface of the display device, and to a tiling display apparatus including the display device.

Description of the Background

A display device is applied to various electronic devices such as TVs, mobile phones, laptops, and tablets. Among display devices, a light-emitting display device has a light-emitting element or a light source built therein, and displays information using light generated from the built-in light-emitting element or the light source. A display device including a self-light-emitting element may be implemented to be thinner than a display device with the built-in light source, and may be implemented as a flexible display device that may be folded, bent, or rolled.

The display device having the self-light-emitting element may include, for example, an organic light-emitting display device (OLED) including a light-emitting layer made of an organic material, or a micro-LED display device (micro light-emitting diode display device) including a light-emitting layer made of an inorganic material.

In this regard, the organic light-emitting display device does not require a separate light source. However, due to material characteristics of the organic material that is vulnerable to moisture and oxygen, a defective pixel may easily occur in the organic light-emitting display device due to the external environment.

On the contrary, the micro-LED display device includes the light-emitting layer made of the inorganic material that is resistant to moisture and oxygen and thus may not be easily affected by the external environment and thus has high reliability, has a long lifespan and has a high image quality compared to the organic light-emitting display device.

Since the micro-LED display device is resistant to the external environment, the micro-LED display device does not require a protective structure such as a sealing material, and various types of materials may be used as a material of a substrate of the display device, thereby a flexible display device with a thinner structure than that of the organic light-emitting display device may be implemented. Accordingly, a plurality of micro-LED display devices may be arranged in first and second horizontal directions intersecting each other to implement a large-area tiling display apparatus, which may be more advantageous than the organic light emitting display device.

Research is being conducted to eliminate a difference between adjacent micro-LED display devices when the tiling display apparatus is implemented by arranging the plurality of micro-LED display devices.

SUMMARY

Accordingly, the present disclosure is directed to a display device and a tiling display apparatus including the display device that substantially obviate one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to provide a display device capable of preventing light-leakage that may occur from a side surface of the display device, and a tiling display apparatus including the display device.

In addition, the present disclosure is to provide a display device including a conductive protective film for protecting the display device from static electricity that may occur on a side surface of the display device, and a tiling display apparatus including the display device.

The present disclosure is not limited to the above-mentioned features. Other features and advantages according to the present disclosure that are not mentioned may be understood based on the following descriptions, and may be more clearly understood based on aspects according to the present disclosure. Further, it will be easily understood that the purposes and advantages according to the present disclosure may be realized using means shown in the claims or combinations thereof.

To achieve these and other advantages and in accordance with the present disclosure, as embodied and broadly described, a display device includes a first substrate on which a plurality of light-emitting elements are disposed; an optical film disposed on one surface of the first substrate, wherein the optical film includes an upper surface, a side surface, and a lower surface; a second substrate bonded to the other surface of the first substrate; a side surface line electrically connecting the first substrate and the second substrate to each other; a side surface sealing member covering the side surface line; and a conductive protective film covering an outer surface of each of the side surface sealing member and the optical film. Accordingly, light-leakage in which the light is emitted from the side surface of the display device may be reduced, and the side surface of the display device may be protected from static electricity.

In another aspect of the present disclosure, a tiling display apparatus includes a plurality of display devices, wherein each of the plurality of display devices includes the display device as described above, wherein the plurality of display devices are arranged so that the conductive protective films of adjacent ones of the plurality of display devices are adjacent to each other. Accordingly, a large-area display apparatus may be realized in which the light-leakage in which the light is emitted from the side surface of the display device may be reduced, and the side surface of the display device may be protected from static electricity.

According to various aspects of the present disclosure, the display device includes the conductive protective film surrounding the side surface of the display device and may prevent damage to and defects of the display device due to external electric shock.

Moreover, according to various aspects the present disclosure, the display device includes the side surface sealing member and the conductive protective film covering the side surface line portion disposed on the side surface of the display device. Thus, the light-leakage on which the light is generated from the side surface of the display device may be reduced, and the boundary between display devices adjacent to each other may be prevented from being recognized by the viewer when implementing the tiling display apparatus.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
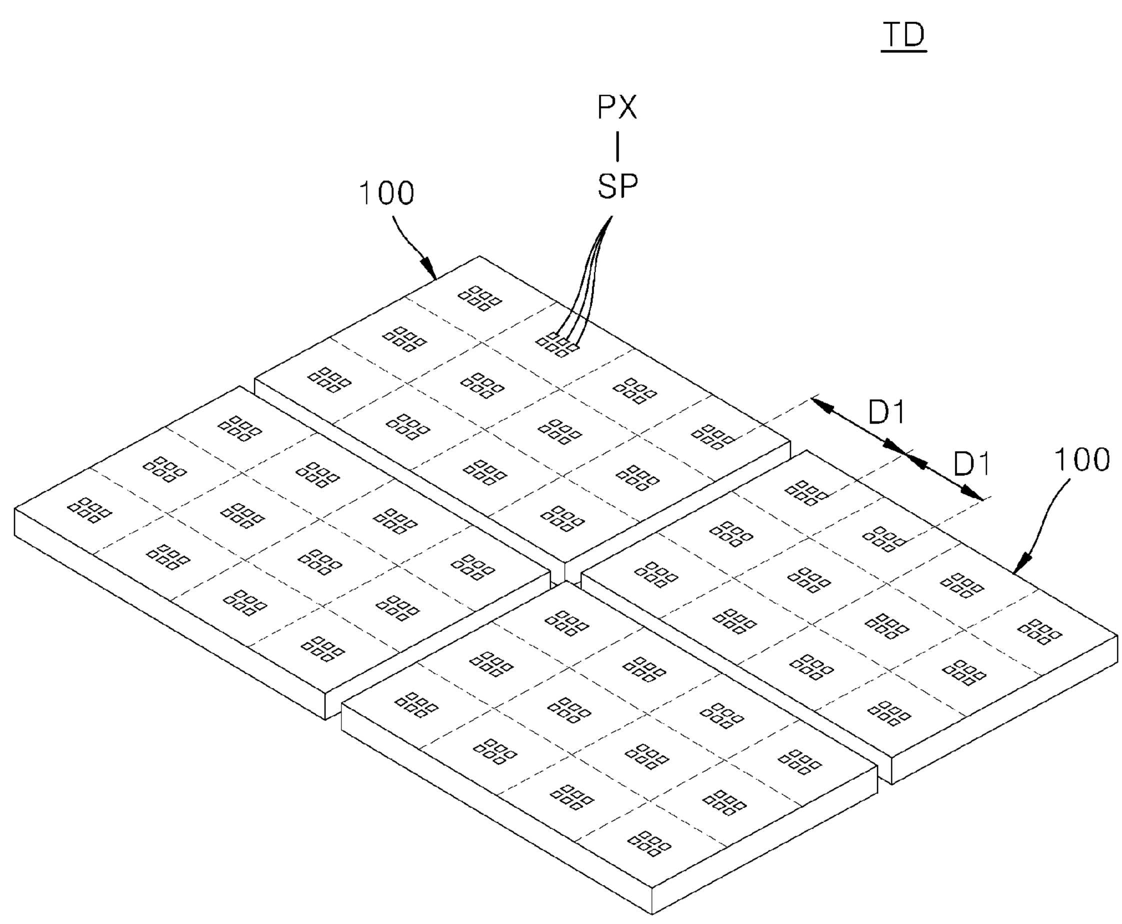
FIG. 1 is a perspective view of a tiling display apparatus according to an aspect of the present disclosure.

Advantages and features of the present disclosure, and a way or method of achieving the advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing aspects of the present disclosure are illustrative, and the present disclosure is not limited thereto. The same reference numerals refer to the same elements herein.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or layer or may be disposed indirectly on the second element or layer with a third element or layer being disposed between the first and second elements or layers. It will be understood that when an element or layer is referred to as being "connected to" another element or layer, it may be directly connected to the another element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on top" of another layer, film, region, plate, or the like, the former may directly contact the latter or still another layer, film, region, plate, or the like may be disposed between the former and the latter. As used herein, when a layer, film, region, plate, or the like is directly disposed "on" or "on top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain aspect may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range even if there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "aspects", "examples", "aspects", and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing aspects.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the detailed descriptions.

Hereinafter, a display device according to the present disclosure will be described with reference to the accompanying drawings.

FIG. 1 is a perspective view of a tiling display apparatus according to an aspect of the present disclosure.

Referring to FIG. 1, a tiling display apparatus TD having a large screen may be implemented by connecting a plurality of display devices 100 with one another. In this case, a side surface structure of the display device 100 may be implemented so that a boundary area (or a seam area) between the display devices 100 adjacent to each other may not be recognized by a viewer. Thus, display quality can be improved.

For example, a plurality of sub-pixels SP may constitute one pixel PX. A spacing D1 between an outermost pixel PX of one display device 100 and an outermost pixel PX of another display device 100 adjacent to one display device 100 may be implemented to be equal to a spacing D1 between pixels PX adjacent to each other in one display device 100. Therefore, the spacing between the pixels PX may be uniform across the display devices 100 adjacent to each other, so that the boundary area may be reduced.

Moreover, when light-leakage occurs on a side surface of the display device 100, the boundary area between the display devices 100 adjacent to each other may be recognized by the viewer. While a plurality of display devices 100 are placed to be adjacent to one another, damage on the side surface of each of the display devices 100 may occur due to collision therebetween. Damage on the side surface of the display device 100, circuit damage, and/or a short circuit may occur due to static electricity generated from the outside. Thus, it is necessary to design a more robust structure of the side surface of the display device 100. The structure of the side surface of the display device 100 will be described in detail with reference to the following drawings.

Figure 2:
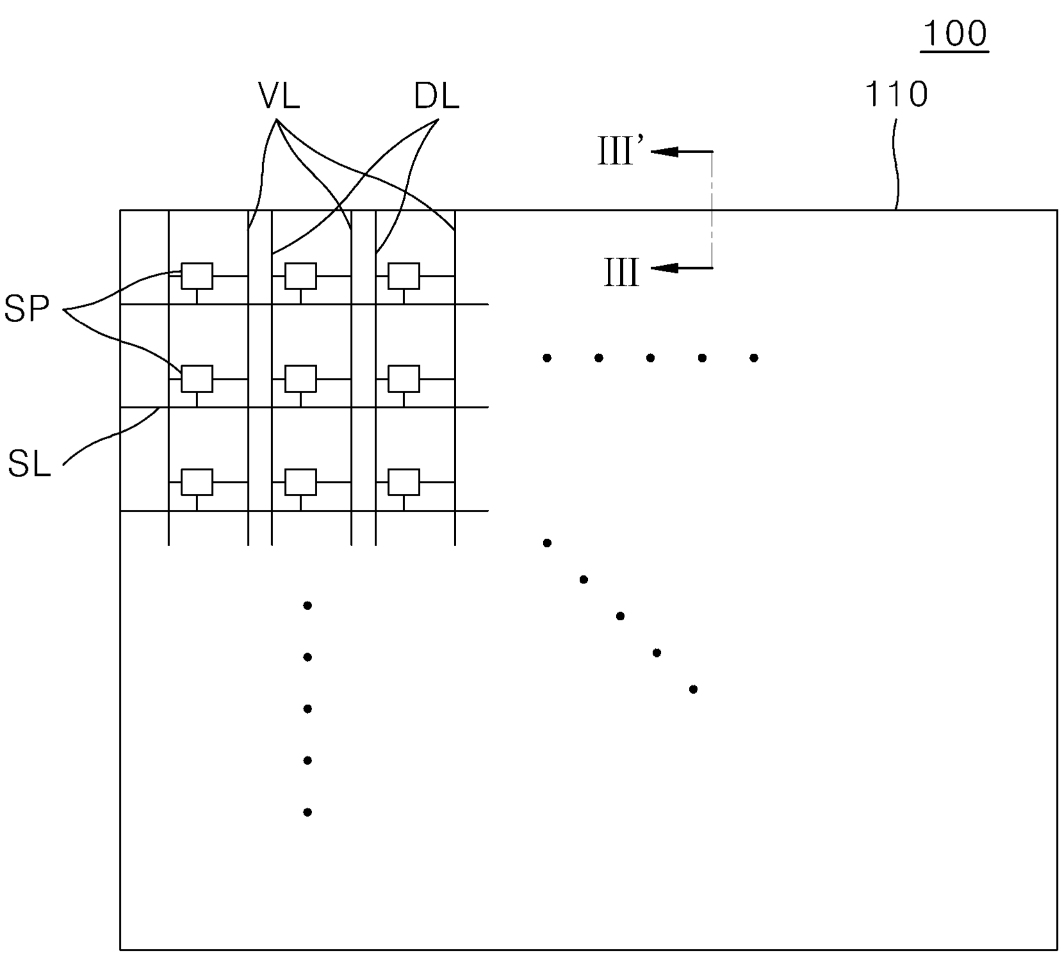
FIG. 2 is a schematic plan view of a display device according to an aspect of the present disclosure.
Figure 3:
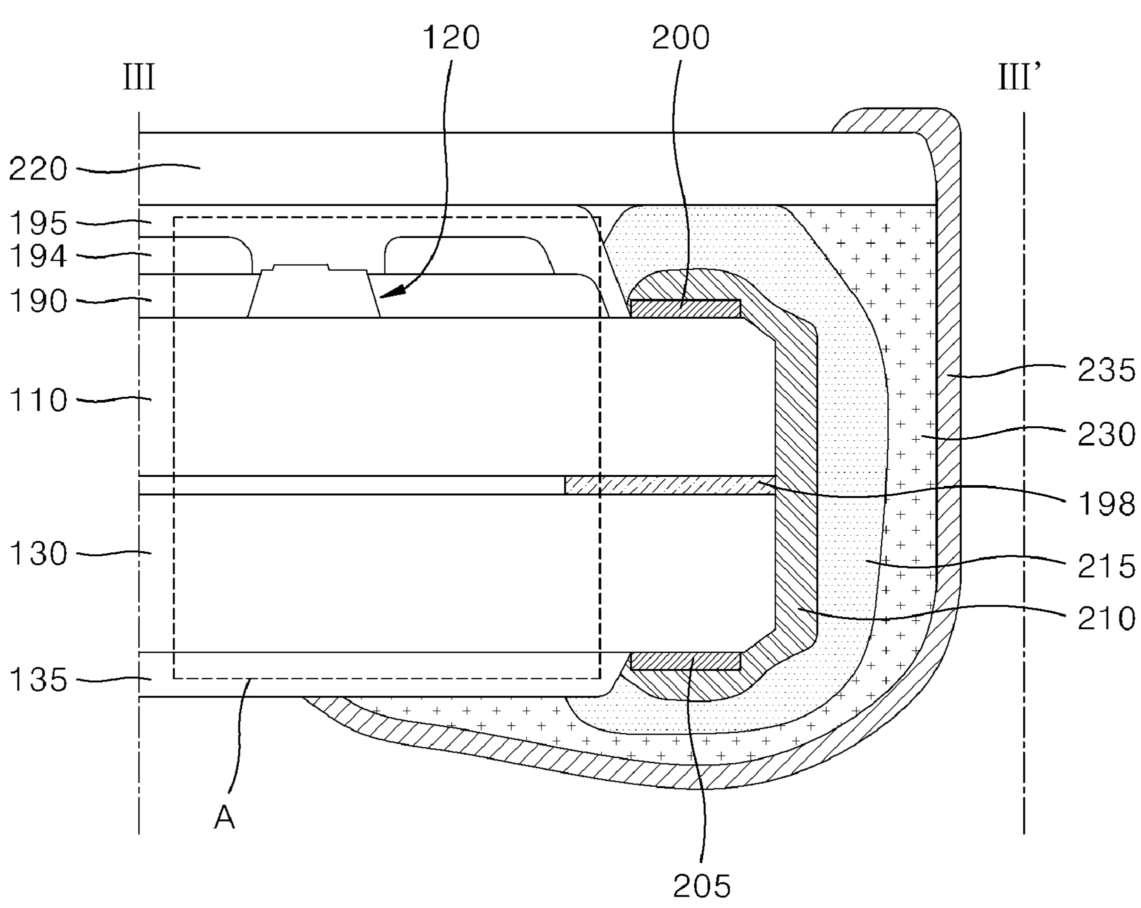
FIG. 3 is a cross-sectional view of the display device taken along line of FIG. 2.
Figure 4:
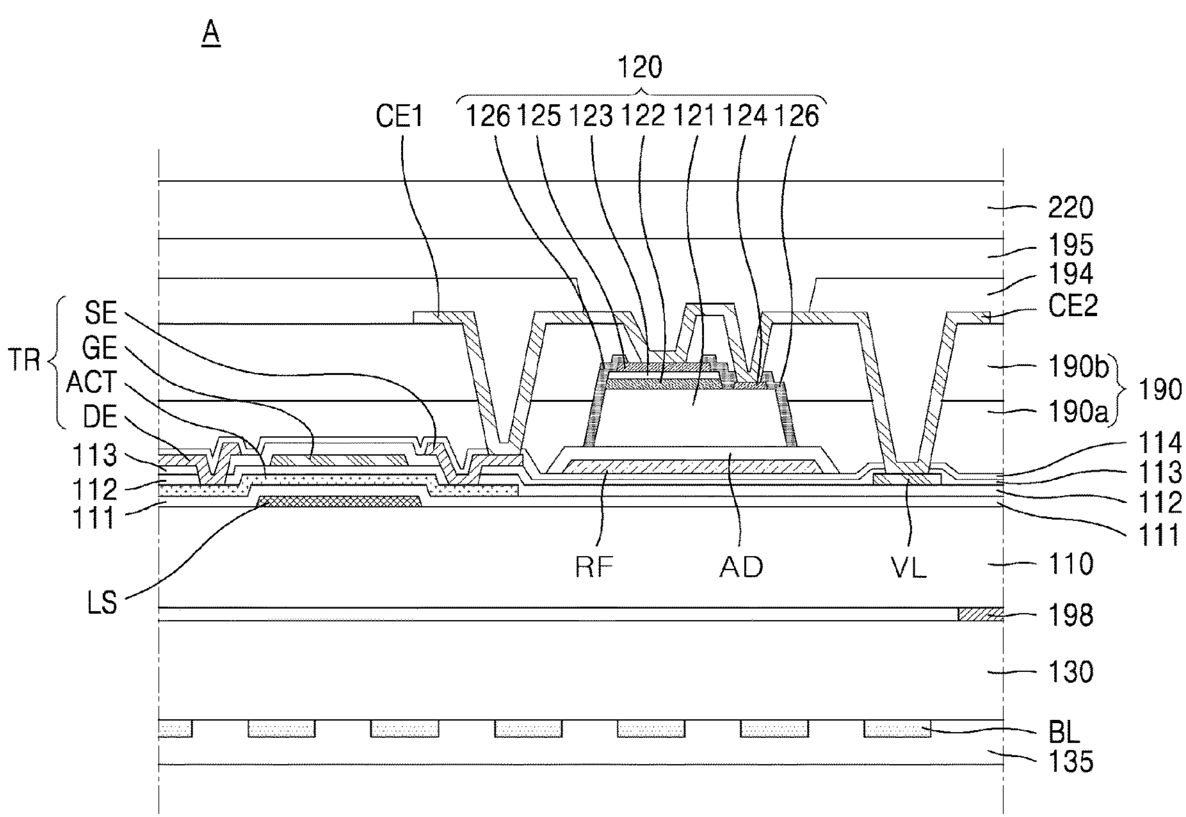
FIG. 4 is an enlarged cross-sectional view of components shown in area A of FIG. 3.

FIG. 2 is a schematic plan view of a display device according to an aspect of the present disclosure. FIG. 3 is a cross-sectional view of the display device taken along line III-III' of FIG. 2. FIG. 4 is a cross-sectional view showing an enlarged view of some components shown in area A of FIG. 3.

Referring to FIG. 2, a first substrate 110 may be a substrate for supporting components of the display device 100 disposed thereon and may be an insulating substrate. For example, the first substrate 110 may be made of glass or resin. Alternatively, the first substrate 110 may be made of polymer or plastic. In other aspects of the present disclosure, the first substrate 110 may be made of a plastic material having flexibility.

A display area and a non-display area may be defined in the first substrate 110. The display area is an area where an image is displayed in the display device 100. A plurality of sub-pixels SP constituting a plurality of pixels and a circuit for driving the plurality of sub-pixels SP may be disposed in the display area. Each of the plurality of sub-pixels SP is a minimum unit constituting the display area. A light-emitting element 120 and a thin-film transistor TR for driving the light-emitting element 120 may be disposed in each of the plurality of sub-pixels SP. A more detailed description of each of the plurality of sub-pixels SP will be described later with reference to FIG. 4.

In the display area, a plurality of signal lines that transmit various signals to the plurality of sub-pixels SP are disposed. For example, the plurality of signal lines may include a plurality of data lines DL respectively supplying a data voltage to the plurality of sub-pixels SP, a plurality of scan lines SL respectively supplying a scan voltage to the plurality of sub-pixels SP. The plurality of scan lines SL may extend in one direction in the display area and be connected to the plurality of sub-pixels SP respectively. The plurality of data lines DL may extend in a direction different from said one direction in the display area and may be connected to the plurality of sub-pixels SP respectively. In addition, a power line VL or the like may be further disposed in the display area. However, the present disclosure is not limited thereto.

The non-display area is an area in which an image is not displayed, and may be an area around the display area. In the non-display area, a link line and a pad electrode for transmitting a signal to the plurality of sub-pixels SP of the display area may be disposed. For example, a plurality of first pad electrodes 200 for respectively transmitting various signals to the plurality of sub-pixels SP on the first substrate 110 may be disposed in the non-display area. Each of the plurality of first pad electrodes 200 may be connected to and disposed between a side surface line 210 to be described later and each of the plurality of signal lines in the display area and may transmit a signal from a plurality of flexible films and a printed circuit board disposed on a rear surface of a second substrate 130 to each of the plurality of sub-pixels SP.

In this case, various signal lines connected to each of the plurality of sub-pixels SP, for example, the scan line SL, the data line DL, the power line VL, etc. may extend from the display area to the non-display area to be electrically connected to the plurality of first pad electrodes 200.

Collectively referring to FIG. 2 to FIG. 4, the plurality of sub-pixels SP are disposed in the display area of the first substrate 110. The light-emitting element 120 and the thin-film transistor TR are disposed in each of the plurality of sub-pixels SP.

A light-blocking layer LS is disposed in each of the plurality of sub-pixels SP and on the first substrate 110. The light-blocking layer LS may prevent light incident from a position under the first substrate 110 from invading an active layer of each of a plurality of transistors to reduce leakage current. For example, the light-blocking layer LS may be disposed under an active layer ACT of the thin-film transistor TR functioning as a driving transistor to prevent light from being incident to the active layer ACT. When light is irradiated to the active layer ACT, reliability of the thin-film transistor TR may deteriorate due to the leakage current. Therefore, the reliability of the thin-film transistor may be improved by disposing the light-blocking layer LS on the first substrate 110. The light-blocking layer LS may be made of an opaque conductive material such as copper (Cu), aluminum (Al), molybdenum (Mo), nickel (Ni), titanium (Ti), and chromium (Cr) or an alloy thereof. However, the present disclosure is not limited thereto.

A buffer layer 111 is disposed on the light-blocking layer LS. The buffer layer 111 may reduce penetration of moisture or impurities through the first substrate 110. The buffer layer 111 may be composed of, for example, a single layer or multi-layers made of silicon oxide (SiOx) or silicon nitride (SiNx). However, the present disclosure is not limited thereto. Moreover, the buffer layer 111 may be omitted depending on a type of the first substrate 110 or a type of the thin-film transistor TR. However, the present disclosure is not limited thereto.

The thin-film transistor TR including the active layer ACT, a gate electrode GE, a source electrode SE, and a drain electrode DE is disposed on the buffer layer 111.

The active layer ACT is disposed on the buffer layer 111. The active layer ACT may be made of a semiconductor material such as oxide semiconductor, amorphous silicon, or polysilicon. However, the present disclosure is not limited thereto.

A gate insulating layer 112 is disposed on the active layer ACT. The gate electrode GE is disposed on the gate insulating layer 112. The gate electrode GE may be made of a conductive material, for example, copper (Cu), aluminum (Al), molybdenum (Mo), nickel (Ni), titanium (Ti), chromium (Cr), or an alloy thereof. However, the present disclosure is not limited thereto.

An interlayer insulating layer 113 is disposed on the gate electrode GE. The source electrode SE and the drain electrode DE electrically connected to the active layer ACT are disposed on the interlayer insulating layer 113. The source electrode SE may be connected to a cathode 125 of the light-emitting element 120, while the drain electrode DE may be connected to a low-potential power line. Each of the source electrode SE and the drain electrode DE may be made of a conductive material such as copper (Cu), aluminum (Al), molybdenum (Mo), nickel (Ni), titanium (Ti), and chromium (Cr), or an alloy thereof. However, the present disclosure is not limited thereto.

A passivation layer 114 for protecting the thin-film transistor TR is disposed on the source electrode SE and the drain electrode DE. The passivation layer 114 may be made of one of an inorganic material such as silicon oxide (SiOx) and silicon nitride (SiNx) or an organic material such as benzocyclobutene or an acryl-based material. However, the present disclosure is not limited thereto.

The power line VL is disposed on the first substrate 110. The power line VL may be a high-potential power line or a low-potential power line. As described above, when the source electrode SE of the thin-film transistor TR is connected to the cathode 125 of the light-emitting element 120, the power line VL is a high-potential power line, and the power line VL is connected to an anode 124 of the light-emitting element 120.

For example, when the source electrode SE of the thin-film transistor TR is connected to the anode 124 of the light-emitting element 120, the power line VL may be a low-potential power line, and the power line VL may be connected to the cathode of the light-emitting element 120.

The low-potential power line may be a line for applying a low-potential power voltage to the light-emitting element 120 or the thin-film transistor TR. The high-potential power line may be a line for applying a high-potential power voltage to the light-emitting element 120 or the thin-film transistor TR.

The power line VL may be made of the same material as that of the gate electrode GE. The gate electrode GE and the power line VL may be disposed in the same layer. However, the present disclosure is not limited thereto, and the power line VL may be made of the same material as that of the light-blocking layer LS or each of the source electrode SE and the drain electrode DE, while the power line VL and the light-blocking layer LS or each of the source electrode SE and the drain electrode DE may be disposed in the same layer. However, the present disclosure is not limited thereto.

A reflective layer RF is disposed on the passivation layer 114. The reflective layer RF is a component for reflecting the light emitted from the light-emitting element 120 upwardly of the first substrate 110, and may be disposed under the light-emitting element 120 and may have a shape corresponding to each of the plurality of sub-pixels SP. The shape of the reflective layer RF is not limited thereto.

An adhesive layer AD is disposed on the reflective layer RF. The adhesive layer AD may bond the light-emitting element 120 onto the reflective layer RF, and may insulate the light-emitting element 120 from the reflective layer RF made of a metal material. The adhesive layer AD may be made of a heat curable material or a light curable material. However, the present disclosure is not limited thereto. In one example, FIG. 4 shows that the adhesive layer AD is disposed only on a partial area of the first substrate 110 overlapping with the reflective layer RF. However, the adhesive layer AD may be disposed on an entirety of a surface of the first substrate 110. However, the present disclosure is not limited thereto.

The light-emitting element 120 is disposed on the adhesive layer AD. The light-emitting element 120 includes an n-type layer 121, an active layer 122, a p-type layer 123, an n-type electrode 124, a p-type electrode 125, and an encapsulating layer 126. Hereinafter, an example is described in which an LED having a horizontal structure is used as the light-emitting element 120. However, the structure of the light-emitting element 120 is not limited thereto. Moreover, the light-emitting element 120 may be a micro-LED. The micro-LED may be an LED made of an inorganic material, and may have a size of 100 μm or smaller, or refers to a light-emitting element free of a growth substrate used for growing the LED.

First, the n-type layer 121 is disposed on the adhesive layer AD. The p-type layer 123 is disposed on the n-type layer 121. Each of the n-type layer 121 and the p-type layer 123 may be formed by doping a specific material with each of n-type and p-type impurities. For example, each of the n-type layer 121 and the p-type layer 123 may be formed by doping the specific material such as gallium nitride (GaN), indium aluminum phosphide (InAlP), and gallium arsenide (GaAs) with each of n-type and p-type impurities. The n-type impurity may be silicon (Si), germanium (Ge), tin (Sn), and the like. The p-type impurity may be magnesium (Mg), zinc (Zn), beryllium (Be), etc. However, the present disclosure is not limited thereto.

The active layer 122 is disposed between the n-type layer 121 and the p-type layer 123. The active layer 122 of the light-emitting element 120 is a layer that emits light. For example, the active layer 122 may be made of indium gallium nitride (InGaN) or gallium nitride (GaN) having a single-layer or multi-quantum well (MQW) structure. However, the present disclosure is not limited thereto.

The light-emitting element 120 may be manufactured by sequentially stacking the n-type layer 121, the active layer 122, and the p-type layer 123, and then etching a predetermined portion thereof and then forming the n-type electrode 124 and the p-type electrode 125 thereon. In this case, the predetermined portion is a space for spacing the n-type electrode 124 and the p-type electrode 125 apart from each other. The predetermined portion of the p-type layer 123 and the active layer 122 may be etched so that a portion of the n-type layer 121 is exposed. In other words, a surface on which the n-type electrode 124 is disposed and a surface on which the p-type electrode 125 is disposed may have different vertical levels.

The n-type electrode 124 may be disposed on the etched portion, that is, on a portion the n-type layer 121 exposed using the etching process. In addition, the p-type electrode 125 may be disposed on a portion that is not etched, that is, on the p-type layer 123. The n-type electrode 124 and the p-type electrode 125 may be made of a conductive material. For example, the n-type electrode 124 and the p-type electrode 125 may be made of a transparent conductive material such as ITO (indium tin oxide) and IZO (indium zinc oxide). In addition, the n-type electrode 124 may be referred to as an anode, and the p-type electrode 125 may be referred to as a cathode.

The light-emitting element 120 includes the encapsulating layer 126 for protecting the n-type layer 121, the active layer 122, and the p-type layer 123. The encapsulating layer 126 surrounds side surfaces of the n-type layer 121, the active layer 122, the p-type layer 123, the n-type electrode 124, and the p-type electrode 125 except for a portion of an upper surface of each of the n-type electrode 124 and the p-type electrode 125.

The light-emitting element 120 including the n-type layer 121, the active layer 122, the p-type layer 123, the n-type electrode 124 and the p-type electrode 125 as formed as described above may be oriented such that a spacing between the n-type layer 121 and the reflective layer RF is smaller than a spacing between each of the n-type electrode 124 and the p-type electrode 125 and the reflective layer RF.

Subsequently, a planarization layer 190 is disposed to secure the light-emitting element 120 onto the first substrate 110. The planarization layer 190 may be disposed on the thin-film transistor TR and the light-emitting element 120 in an area other than a contact-hole. In this case, the planarization layer 190 may be formed such that a partial area of each of the p-type electrode 125 and the n-type electrode 124 of the light-emitting element 120 is open. The planarization layer 190 may be made of an organic insulating material. For example, the planarization layer 190 may be made of benzocyclobutene or an acryl-based organic insulating material. However, the present disclosure is not limited thereto. Moreover, the planarization layer 190 may be composed of a stack of two layers, that is, a first planarization layer 190*a* and a second planarization layer 190*b*. However, the present disclosure is not limited thereto.

A first connection electrode CE1 may be an electrode for connecting the thin-film transistor TR to the p-type electrode 125 of the light-emitting element 120. The first connection electrode CE1 is connected to the source electrode SE of the thin-film transistor TR via a contact-hole formed in the planarization layer 190 and the adhesive layer AD, and is connected to the p-type electrode 125 of the light-emitting element 120 via a contact-hole formed in the planarization layer 190. However, the present disclosure is not limited thereto, and the first connection electrode CE1 may be connected to the drain electrode DE of the thin-film transistor TR depending on a type of the thin-film transistor TR. The first connection electrode CE1 may be made of a conductive material, for example, a transparent conductive material such as ITO (indium tin oxide) and IZO (indium zinc oxide). However, the present disclosure is not limited thereto.

A second connection electrode CE2 may be an electrode for connecting the power line VL to the n-type electrode 124 of the light-emitting element 120. The second connection electrode CE2 may be connected to the power line VL via a contact-hole formed in the planarization layer 190, the adhesive layer AD, the passivation layer 114, and the interlayer insulating layer 113 and may be connected to the n-type electrode 124 of the light-emitting element 120 via a contact-hole formed in the planarization layer 190. The second connection electrode CE2 may be made of a conductive material, for example, a transparent conductive material such as ITO (indium tin oxide) and IZO (indium zinc oxide). However, the present disclosure is not limited thereto.

The connection relationship of the first connection electrode CE1 and the second connection electrode CE2 with the light-emitting element 120 and the thin-film transistor TR is not limited thereto, and may vary depending on a relationship thereof with the light-emitting element 120 and a pixel circuit providing a driving current to the light-emitting element 120.

Accordingly, when the display device 100 is turned on, voltages of different voltage levels respectively applied to the source electrode SE of the thin-film transistor TR and the power line VL may be respectively transferred to the p-type electrode 125 and the n-type electrode 124 via the first connection electrode CE1 and the second connection electrode CE2, such that the light-emitting element 120 may emit light.

Next, a bank 194 is disposed on the planarization layer 190, the first connection electrode CE1 and the second connection electrode CE2. The bank 194 is an insulating layer for defining each of the plurality of sub-pixels SP. The bank 194 may be disposed between adjacent ones of the plurality of sub-pixels SP to prevent color mixing between light beams respectively emitted from the light-emitting elements 120 of the sub-pixels SP adjacent to each other. The bank 194 may be made of an organic insulating material. For example, the bank 194 may be made of the same material as that of the planarization layer 190. Alternatively, the bank 194 may be made of an organic insulating material including a black material, so that the lines visible through the display area may be hidden.

A protective layer 195 is disposed on the bank 194. The protective layer 195 may planarize a step caused by the components on the first substrate 110 and protect the components under the protective layer 195. The protective layer 195 may be made of an organic insulating material. For example, the protective layer 195 may be made of benzocyclobutene or an acryl-based organic insulating material. However, the present disclosure is not limited thereto.

Referring to FIG. 3, the second substrate 130 is disposed under the first substrate 110. The second substrate 130 is a substrate supporting components disposed under the display device 100 and may be an insulating substrate. For example, the second substrate 130 may be made of organic or resin. Alternatively, the second substrate 130 may be made of a polymer or a plastic. The second substrate 130 may be made of the same material as that of the first substrate 110. In some aspects, the second substrate 130 may be made of a plastic material having flexibility.

A bonding layer 198 is disposed between the first substrate 110 and the second substrate 130. The bonding layer 198 may be made of a material which may be cured in various cured schemes to be capable of bonding the first substrate 110 and the second substrate 130 to each other. The bonding layer 198 may be disposed only in a partial area or an entire area between the first substrate 110 and the second substrate 130.

A plurality of second pad electrodes 205 are disposed on a rear surface of the second substrate 130. The plurality of second pad electrodes 205 may respectively transfer a signal from a driver disposed on the rear surface of the second substrate 130 to a plurality of side surface lines 210, and the plurality of first pad electrodes 200, and the plurality of signal lines on the first substrate 110. Each of the plurality of second pad electrodes 205 may be disposed on one surface of the second substrate 130 to be electrically connected to each of the side surface lines 210 covering one surface of the second substrate 130.

In this case, each of the plurality of first pad electrodes 200 may be disposed to correspond to each of the plurality of second pad electrodes 205. Thus, the first pad electrode 200 and the second pad electrode 205 overlapping with each other may be electrically connected to each other via a corresponding side surface line 210.

In one example, rear surface lines BL may be disposed on the rear surface of the second substrate 130. The second substrate 130 and the rear surface lines BL may be covered with a third planarization layer 135. For example, the rear surface line BL may be the power line such as a high-potential power line or a low-potential power line. The power line may be composed of several lines as shown in the drawing, or may be formed as a single integral electrode which may be disposed on a wide area of the rear surface of the second substrate 130. When the power line is formed as the single integral electrode disposed on the rear surface of the second substrate 130, the resistance and voltage drop of the power line may be reduced.

The third planarization layer 135 formed on the rear surface line BL may be disposed adjacent to the second pad electrode 205. The third planarization layer 135 may protect the rear surface line BL disposed on the rear surface of the second substrate 130.

Each of the first pad electrode 200 and the second pad electrode 205 may be composed of a single layer or multiple layers made of a conductive material, for example, copper (Cu), aluminum (Al), molybdenum (Mo), nickel (Ni), titanium (Ti), chromium (Cr) or an alloy thereof. However, the present disclosure is not limited thereto.

In one example, the driver including the plurality of flexible films and the printed circuit board may be disposed on the rear surface of the second substrate 130. Each of the plurality of flexible films is a component which supplies a signal to each of the plurality of sub-pixels SP. Each of the plurality of flexible films includes a flexible base film and various components such as a gate driver IC and a data driver IC disposed on the flexible base film. The printed circuit board is a component that is electrically connected to the plurality of flexible films and supplies the signal to the driver ICs. Various components for supplying various signals such as a driving signal and a data signal to the driver ICs may be disposed in the printed circuit board.

For example, the second pad electrodes 205 may extend toward the plurality of flexible films disposed on the rear surface of the second substrate 130 to be respectively electrically connected to the plurality of flexible films. The plurality of flexible films may supply various signals to the plurality of side surface lines 210, the plurality of first pad electrodes 200, the plurality of signal lines, and the plurality of sub-pixels SP via the second pad electrodes 205, respectively. Accordingly, the signal from the driver may flow through the plurality of second pad electrodes 205 of the second substrate 130, the plurality of side surface lines 210, and the plurality of first pad electrodes 200 of the first substrate 110 and then may be transmitted to the signal line of the front surface of the first substrate 110 and the plurality of sub-pixels SP.

The plurality of side surface lines 210 are disposed on the side surfaces of the first substrate 110 and the second substrate 130. The plurality of side surface lines 210 may electrically connect the plurality of first pad electrodes 200 formed on an upper surface of the first substrate 130 to the plurality of second pad electrodes 205 formed on the rear surface of the second substrate 130, respectively. Each of the plurality of side surface lines 210 may extend to surround the side surface of the display device 100. Each of the plurality of side surface lines 210 covers the first pad electrode 200 at an end of the first substrate 110 and the second pad electrode 205 at an end of the second substrate 130. For example, the plurality of side surface lines 210 may be formed in a pad printing scheme using a conductive ink containing silver (Ag), copper (Cu), molybdenum (Mo), or chromium (Cr).

A side surface line protective film 215 covering the plurality of side surface lines 210 is disposed. The side surface line protective film 215 may be formed on the upper surface of the first substrate 110, the side surface of the first substrate 110, the side surface of the second substrate 130, and the rear surface of the second substrate 130 to cover the side surface lines 210. The side surface line protective film 215 may protect the plurality of side surfaces line 210. Moreover, the side surface line protective film 215 serves to prevent abnormal phenomena such as migration of a conductive material or a metal material constituting the side surface line 210. The migration phenomenon means that a metal component constituting the plurality of side surface lines 210 are ionized and diffused to surroundings. As the metal component constituting the side surface line 210 diffuses to the surroundings due to the migration phenomenon, a short circuit defect between adjacent side surface lines 210 may occur. However, the side surface line protective film 215 may be disposed between adjacent ones of the plurality of side surface lines 210 to block the diffusion of the metal component constituting the side surface lines 210. However, the side surface line protective film 215 alone may not completely prevent the migration. For this reason, a film may be added to the side surfaces of the first substrate 110 and the second substrate 130.

The side surface line protective film 215 may be disposed to surround an exposed outer surface of the side surface line 210. Moreover, the side surface line protective film 215 may be formed to cover an edge of a sealing layer 195 disposed on the first substrate 110 and to cover or be spaced apart from an edge of the third planarization layer 135 disposed on the second substrate 130.

In one example, when each of the plurality of side surface lines 210 is made of a metal material, external light may be reflected from the plurality of side surface lines 210 or light emitted from the light-emitting element 120 may be reflected from the plurality of side surface lines 210 and then may be recognized by a user. For this reason, the side surface line protective film 215 may be configured to include a black material to suppress reflection of the external light. For example, the side surface line protective film 215 may be formed in a pad printing scheme using an insulating material containing a black material, for example, black ink.

A side surface sealing member 230 is disposed on the side surface line protective film 215. The side surface sealing member 230 is disposed to surround the side surface of the display device 100 to protect the display device 100 from external impact, moisture, oxygen, and the like. For example, the side surface sealing member 230 may be made of polyimide (PI), polyurethane, epoxy, or acryl-based insulating material, etc. However, the present disclosure is not limited thereto. The side surface sealing member 230 may be disposed on a rear surface of an optical film to be described later and extend to cover a portion of the side surface line protective film 215 and an edge portion of the third planarization layer 135 disposed on the second substrate 130.

An optical film 220 is disposed on the side surface sealing member 230 and the sealing layer 195. An outer edge of the side surface sealing member 230 and an outer edge of the optical film 220 may be aligned with each other in the same line. The optical film 220 may be a functional film that implements a higher quality image while protecting the display device 100. For example, the optical film 220 may include, but is not limited to, an anti-scattering film, an antiglare film, an antireflection film, a low reflection film, a luminance enhancement film, or a polarizer.

A conductive protective film 235 is disposed on an outer surface of the side surface sealing member 230. The conductive protective film 235 may be formed to cover a side surface and an end of an upper surface of the optical film 220, the side surface sealing member 230, and a portion of the third planarization layer 135 disposed on the second substrate 130. The conductive protective film 235 may be formed along a profile of the side surface sealing member 230 and may entirely cover the side surface sealing member 230.

The conductive protective film 235 may be made of an organic material containing conductive carbon black particles or a black material containing metal particles. In this case, a size of each of the conductive carbon black particles may be in a range of 10 nm to 100 nm. The organic material may be epoxy or acryl-based material, etc. The metal particle may be made of silver (Ag), copper (Cu), molybdenum (Mo), etc. The black material may be a black dye or a black pigment. Further, the conductive protective film 235 may have a thickness of 3 μm or greater.

When an optical density (OD) value, and light-leakage are measured at a distance of about 20 μm from the side surface of the display device 100 on which the conductive protective film 235 having a thickness of 3 μm is disposed, the optical density value is 2 and the light-leakage is 45.9 nit. When using the display device 100 alone or implementing the tiling display apparatus TD by tiling the plurality of display devices 100 with each other, to prevent light-leakage from occurring on the side surface of the display device 100 so that the boundary area between the display devices adjacent to each other is not recognized by the viewer in front of the display device or on a side of the display device, the optical density value on the side surface of the display device 100 should be 2 or greater, and the light-leakage on the side surface of the display device 100 should be smaller than 50 nit. To this end, the conductive protective film 235 may be formed to have a thickness of 3 μm or greater. In this regard, the optical density value indicates how dark the side surface of the display device is, and indicates an amount of light leaking from the side surface. The higher the OD value, the darker the side surface of the display device.

A portion of the conductive protective film 235 included in the display device 100 according to an aspect of the present disclosure as disposed on the side surface and the upper surface of the optical film 220 is formed to have a thickness of 3 μm or greater, such that the light-leakage occurring on the side surface of the display device 100, specifically, the side surface of the optical film 220 may be prevented.

Moreover, when the conductive protective film 235 is formed to have the thickness of 3 μm or greater, the display device has no static electricity-related defect when an electric field of 15 kV or greater, that is, 17 kV is applied thereto in a static electricity discharge evaluation test. The static electricity discharge evaluation is performed on the side surface of the display device 100 by generating the electric field of 15 kV or greater on the side surface of the display device 100, specifically, on the side surface of the optical film 220 using a static electricity gun, and then observing whether the static electricity-related defect occurs on the circuit, the elements, etc. of the display device 100. In general, to ensure that the circuit and the elements of the display device 100 are not damaged by the static electricity, the circuit and the elements of the display device 100 should not be affected by the electric field of 15 kV or greater which is generated on the side surface of the display device 100.

A portion of the conductive protective film 235 included in the display device 100 according to an aspect of the present disclosure as disposed on the side surface and the upper surface of the optical film 220 is formed to have a thickness of 3 μm or greater, thereby the static electricity generated on the side surface of the display device 100, specifically, the side surface of the optical film 220 may be discharged.

Moreover, when the conductive protective film 235 is formed to have a thickness of 3 μm or greater, the effect of preventing the migration of the side surface line 210 may be improved compared to that when the conductive protective film 235 is formed to have a thickness smaller than 3 μm or is absent. Evaluation of the occurrence of the migration of the side surface line 210 may be performed in a high temperature/high humidity environment. For example, the display device 100 is left in an environment of 50° C. temperature/80% humidity, and then a time at which the migration occurs in the side surface line 210 is measured. In this regard, it may be identified that in the display device 100 including the conductive protective film 235 of 3 μm or greater, the time at which the migration in the side surface line 210 occurs is delayed by 30% compared to the time at which the migration of the side surface line 210 occurs in the display device 100 in which the conductive protective film 235 is formed to have a thickness smaller than 3 μm or is absent.

The conductive protective film 235 included in the display device 100 according to an aspect of the present disclosure is formed to cover the side surface and the upper surface of the optical film 220, thereby the light-leakage on the side surface of the optical film 220 exposed to the outside may be prevented, and deterioration of image quality, panel damage and defects of the display device 100 due to the static electricity generated on the side surface of the optical film 220 exposed to the outside may be prevented, thereby reliability of the display device 100 may be improved.

FIG. 5 to FIG. 9 are diagrams for illustrating a method for manufacturing a display device according to an aspect of the present disclosure. FIG. 10 is a cross-sectional view showing a structure of an optical film included in a display device according to an aspect of the present disclosure.

Figure 5:
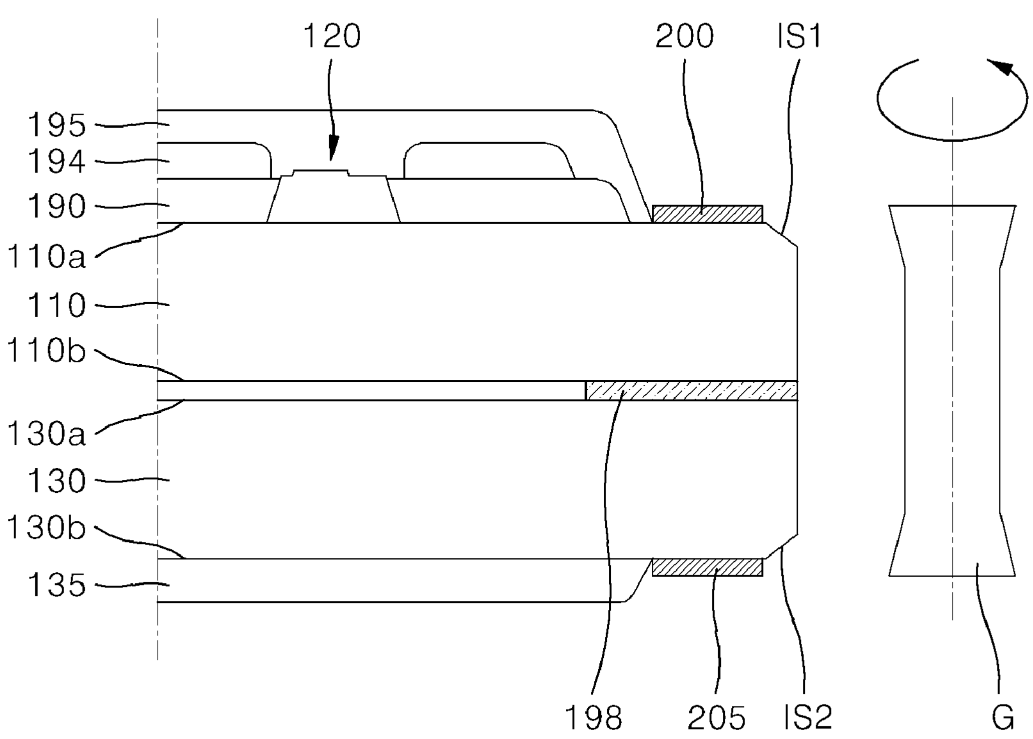
FIG. 5 to FIG. 10 are diagrams for illustrating a method for manufacturing a display device according to an aspect of the present disclosure.

Referring to FIG. 5, the light-emitting element 120 and the protective layer 195 covering the light-emitting element 120 are disposed on the first substrate 110. The second substrate 130 is attached to a rear surface of the first substrate 110. Then, a first inclined surface IS1 and a second inclined surface IS2 are formed on edges of the first substrate 110 and the second substrate 130 disposed outwardly of the first pad electrode 200 and the second pad electrode 205, respectively. The first inclined surface IS1 and the second inclined surface IS2 may be formed using a grind wheel device G.

The first substrate 110 may include a first surface 110*a* on which the light-emitting element 120 is disposed, a second surface 110*b* opposite to the first surface 110*a*, and a first side surface disposed between the first surface 110*a* and the second surface 110*b*. A first surface 130*a* of the second substrate 130 may be bonded to the second surface 110*b* opposite to the first surface 110*a* of the first substrate 110. The second substrate 130 may include the first surface 130*a* bonded to the first substrate 110, a second surface 130*b* opposite to the first surface 130*a*, and a second side surface disposed between the first surface 130*a* and the second surface 130*b*.

The first inclined surface IS1 is disposed on top of the first side surface of the first substrate 110. The second inclined surface IS2 is disposed under the second side surface of the second substrate 130. The first inclined surface IS1 and the second inclined surface IS2 make it easy to dispose the side surface line for connecting the first pad electrode 200 and the second pad electrode 205 to each other. When the plurality of display devices 100 are arranged to be combined with each other, the first inclined surface IS1 and the second inclined surface IS2 may prevent damage caused due to collision between corners of the substrates of the plurality of display devices 100. The grind wheel device G may grind corners of the first substrate 110 and the second substrate 130 to form the first inclined surface IS1 and the second inclined surface IS2, respectively.

Figure 6:
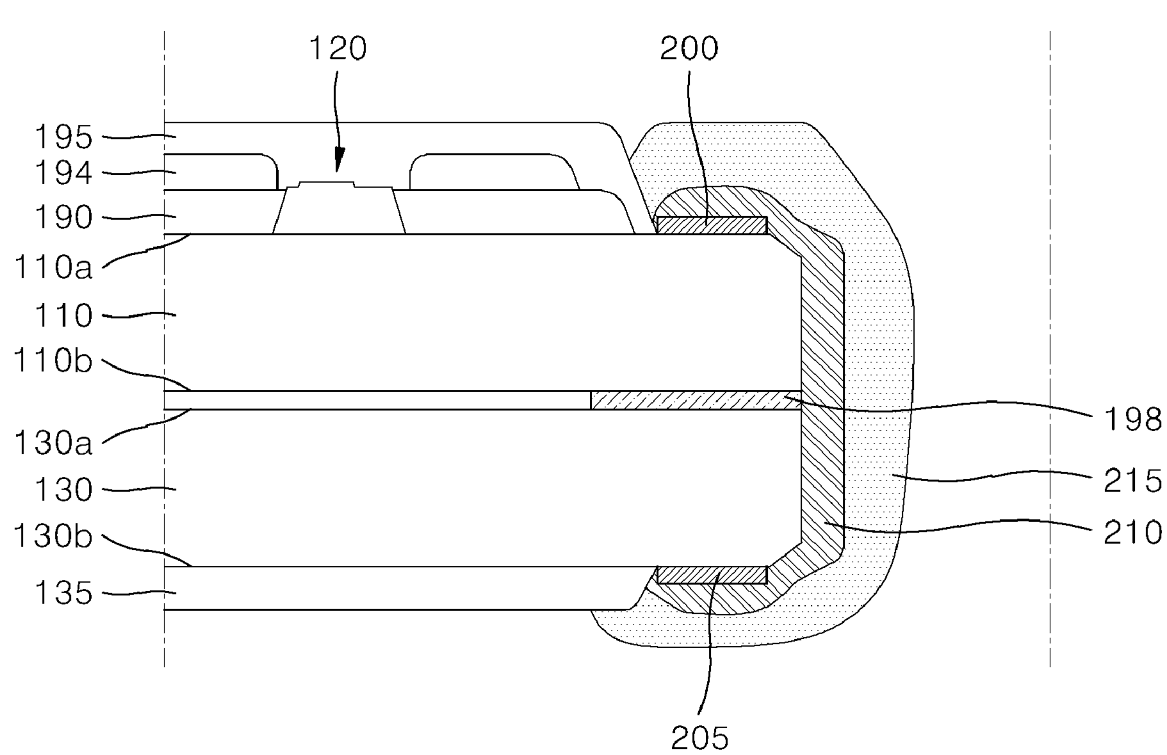

Referring to FIG. 6, the plurality of side surface lines 210 are formed on the side surfaces of the first substrate 110 and the second substrate 130. The side surface line 210 may electrically connect the first pad electrode 200 disposed on the outermost area of the first substrate 110 and the second pad electrode 205 disposed on the outermost area of the second substrate 130 to each other. The side surface line 210 may be formed by applying or printing a paste type conductive material or metal material on the side surfaces of the first substrate 110 and the second substrate 130, and performing a drying and curing process thereon. The side surface line 210 may transmit a signal transmitted from the driver disposed on the rear surface of the second substrate 130 to the light-emitting element 120 disposed on the first substrate 110 such that the light-emitting element 120 emits light.

The side surface line 210 may have "a 90 degrees-rotated U shape" to cover the first pad electrode 200 disposed on the first surface 110*a* of the first substrate 110, the side surface of the first substrate 110, the side surface of the second substrate 113, and the second pad electrode 205 disposed on the second surface 130*b* of the second substrate 130.

Subsequently, the side surface line protective film 215 is formed on the side surface line 210. The side surface line protective film 215 serves to prevent abnormal phenomena such as migration of a conductive material or metal material constituting the side surface line 210. Moreover, the side surface line protective film 215 serves to prevent the side surface line 210 from being damaged by the external environment. The side surface line protective film 215 may include an insulating material. For example, the side surface line protective film 215 may be formed by pad-printing a black ink material. In the pad printing scheme, the black ink may be applied to a printing pad made of a silicon material, and then the printing pad may be brought into contact with each of the side surfaces of the first substrate 110 and the second substrate 130 such that the side surface line protective film 215 may be formed.

The side surface line protective film 215 may entirely covers the plurality of side surface lines 210, and may cover the edge portion of the sealing layer 195.

Figure 7:
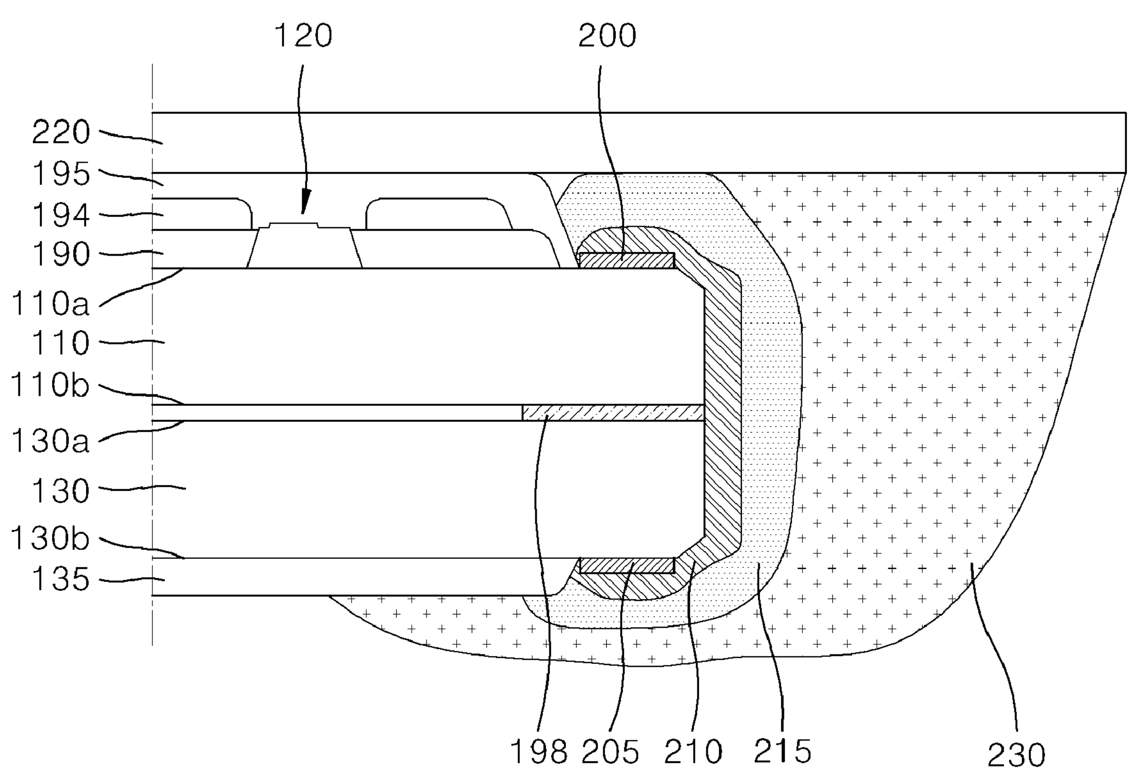

Referring to FIG. 7, the optical film 220 may be disposed on the sealing layer 195. The optical film 220 protects the light-emitting element 120 from external impact, and may improve aesthetics and visibility of the display device 100.

Subsequently, the side surface sealing member 230 is formed on the side surfaces of the first substrate 110 and the second substrate 130. The side surface sealing member 230 may protect the side surface line 210, and may fix the optical film 220, the first substrate 110 and the second substrate 130 to each other. Moreover, since the side surface sealing member 230 is made of an opaque material, the side surface sealing member 230 may block the light that may be emitted through end surfaces of the first substrate 110 and the second substrate 130. Accordingly, the side surface sealing member 230 prevents a boundary between the display devices 100 adjacent to each other from being recognized by the viewer when combining the plurality of display devices 100 with each other in a tiling manner to manufacture the tiling display apparatus.

The side surface sealing member 230 may be formed to have a thickness sufficient to cover a sum of thicknesses of the first substrate 110 and the second substrate 130, and may cover a portion of a surface of the third planarization layer 135 disposed on the second substrate 130.

The applied side surface sealing member 230 may be fixedly cured under a UV-based curing process. The side surface sealing member 230 may include acryl or urethane-based resin.

Figure 8:
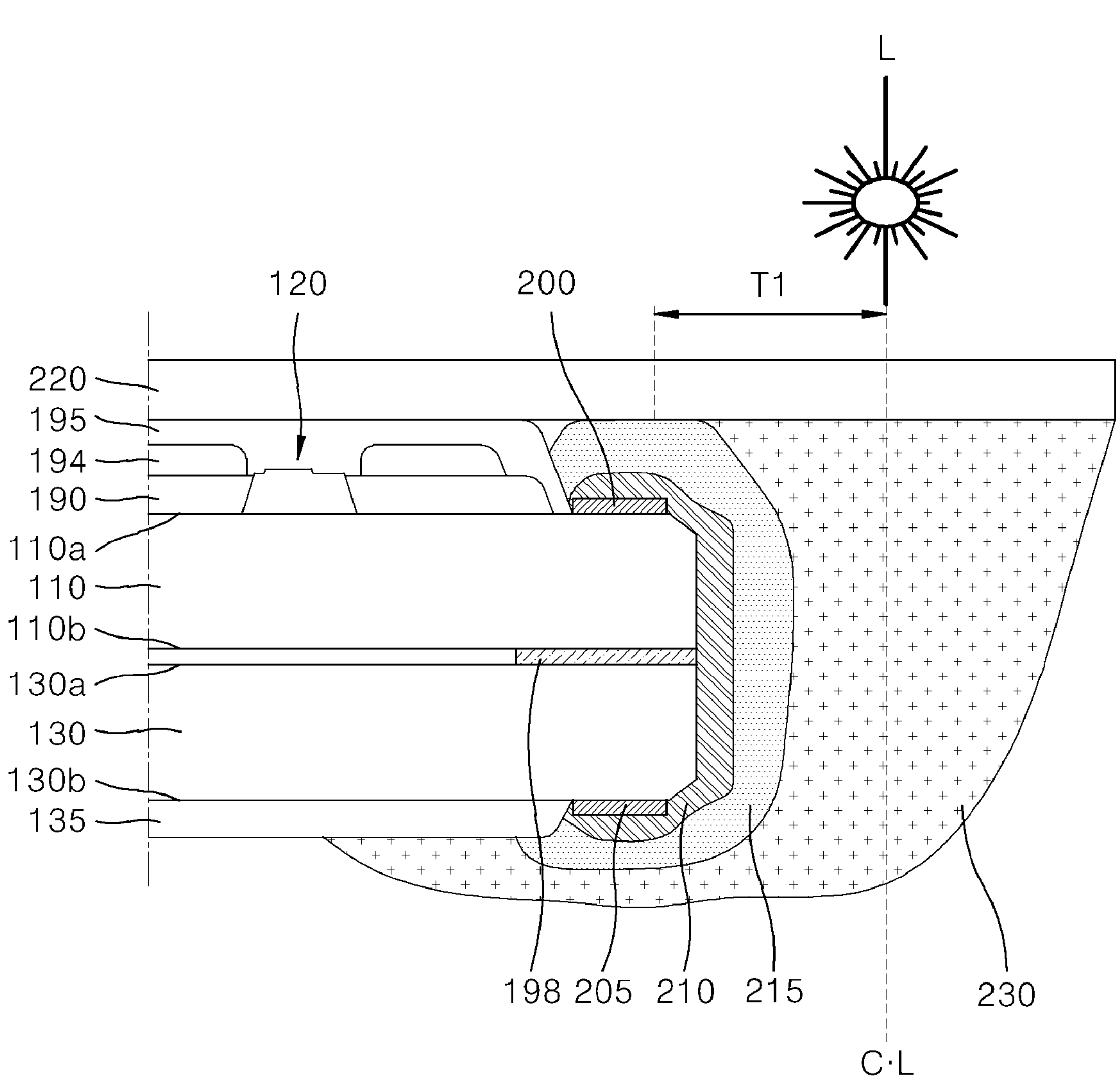

Referring to FIG. 8, a laser cutting process of cutting the side surface sealing member 230 along a cutting line CL is performed using a laser device L. Referring to FIG. 1, the laser cutting process may include cutting a portion in a width direction of each of the optical film 220 and the side surface sealing member 230 to meet the spacing D1 between the outermost pixels PX. The cutting process using the laser device L may be performed by repeatedly irradiating the laser beam onto the side surface sealing member 230. According to one aspect, during the laser cutting process, the laser beam may be irradiated to the cutting line CL as a target point in a repeated manner.

The laser cutting process may be performed such that a cut side surface of the optical film 220 and a cut side surface of the side surface sealing member 230 may be aligned with each other in the same line.

Figure 9:
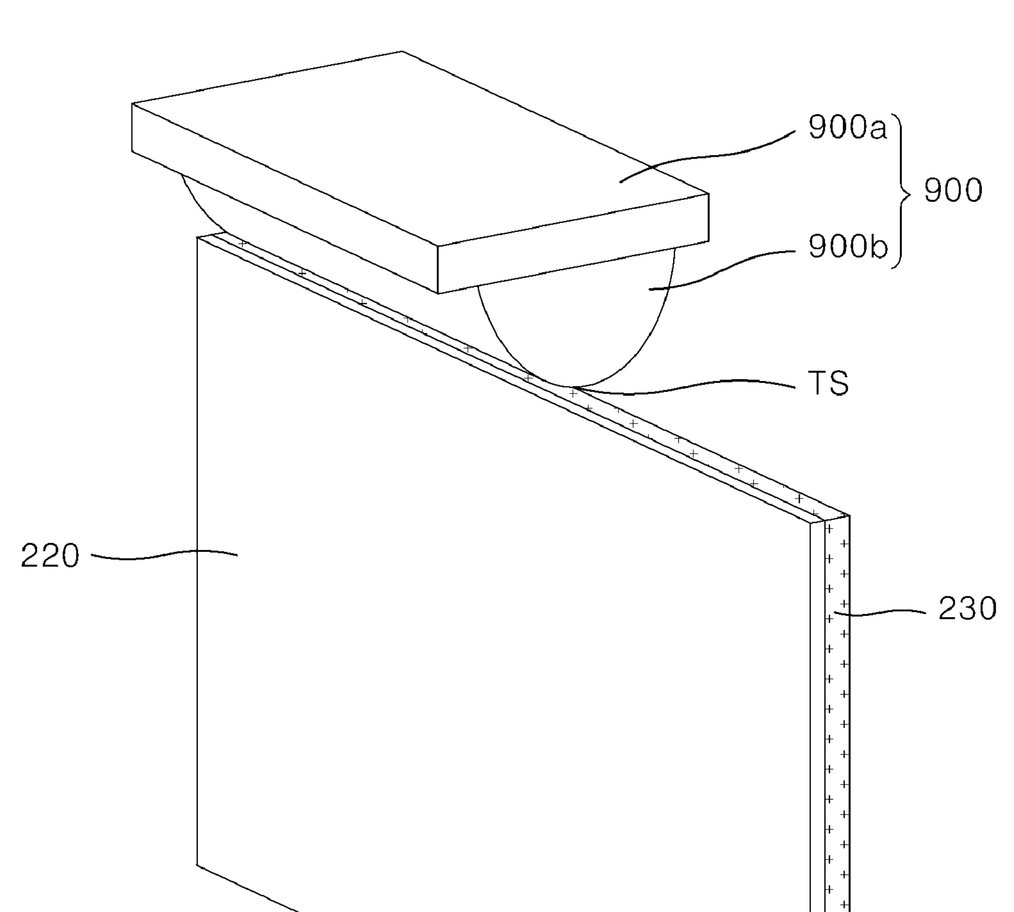
Figure 10:
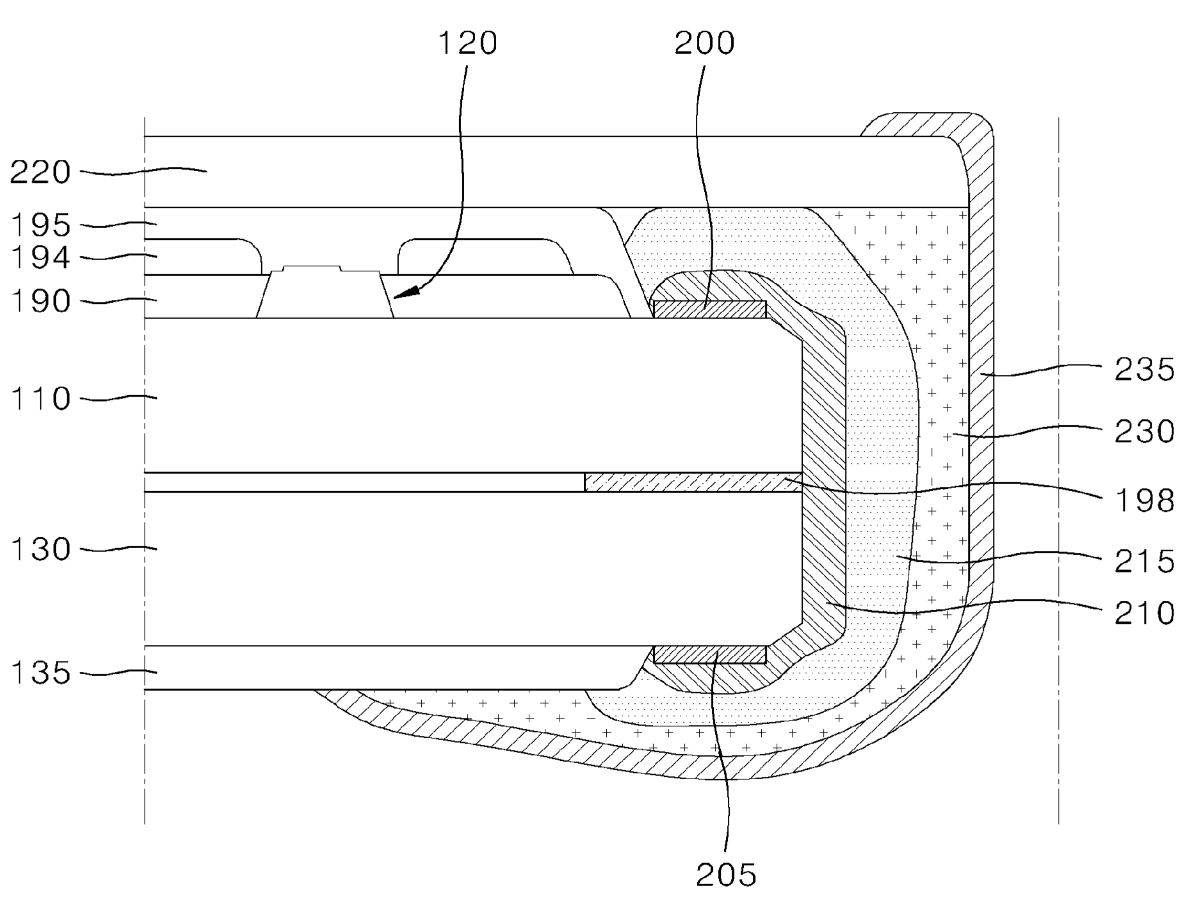

Referring to FIG. 9 and FIG. 10, the conductive protective film 235 covering a portion of the optical film 220 and the side surface sealing member 230 is formed. The conductive protective film 235 may be formed in a pad printing scheme using printing means 900. The printing means 900 may include a base substrate 900*a* and a silicone pad 900*b* having a convex shape and disposed on the base substrate 900*a* and having elasticity. A convex area TS of the silicone pad 900*b* of the printing means 900 may be coated with a material constituting the conductive protective film 235, and then, the convex area TS of the silicone pad 900*b* may be brought into contact with the side surfaces of the first substrate 110 and the second substrate 130 on which the side surface sealing member 230 has been formed. Thus, as shown in FIG. 10, the conductive protective film 235 may be formed.

Figure 11:
FIG. 11 is a cross-sectional view showing a structure of an optical film included in a display device according to an aspect of the present disclosure.

In one example, referring to FIG. 11, FIG. 11 shows a structure in which a protective film 240 is disposed on the optical film 220. The optical film 220 includes an adhesive layer 220*b* and a base film 220*a*. The adhesive layer 220*b* may be adhered to an object under light pressure, may have an adhesive strength varying depending on the pressure, and may have re-adhesive ability after peeling off thereof. The base film 220*a* may be a protective layer made of a transparent material such as TAC (triacetyl cellulose) or PET (polyethylene terephthalate).

The optical film 220 having the protective film 240 disposed thereon is disposed on top of the sealing layer 195. The conductive protective film 235 is formed in a state where the protective film 240 has been disposed thereon. In this case, a conductive protective film material may invade between the protective film 240 and the optical film 220, and then the protective film 240 may be removed.

A distance by which the conductive protective film material invades between the protective film 240 and the optical film 220 may vary depending on a thickness of the conductive protective film 235. When the distance by which the conductive protective film material invades between the protective film 240 and the optical film 220 is large, the conductive protective film may be visible to the viewer in front of the display device. The distance by which the conductive protective film 235 extends after the protective film 240 is removed should be 100 μm or smaller such that the conductive protective film material is not visible to the viewer in front of the display device. In addition, in order for the distance to be 100 μm or smaller, the thickness of the conductive protective film material must be 4.5 μm or smaller.

Therefore, a portion of the conductive protective film 235 included in the display device according to an aspect of the present disclosure and disposed on an upper surface of the optical film 220 may have a width of 100 μm or smaller, and the thickness of the conductive protective film 235 may be 4.5 μm or smaller.

In one example, the optical film 220 is a transparent film. Thus, the light-leakage may occur on a side surface of the optical film 220. Moreover, the display device may be damaged or defective due to unnecessary voltage or static electricity applied from the outside through the side surface of the optical film 220. Moreover, when the side surface of the display device where the side surface sealing member 230 made of the organic material is disposed has no static electricity prevention film, there is no path to discharge the static electricity applied to the side surface to the outside. Further, a thickness of the side surface sealing member may be smaller to implement the tiling display apparatus. Thus, a short circuit or pad corrosion may occur due to an external electric shock through the side surface, thereby a display device failure may be caused.

To prevent display device defects and light-leakage caused by static electricity applied to the side surface, the conductive protective film 235 which is a conductive material layer may be formed on the side surfaces of the optical film 220 and the side surface sealing member 230.

Moreover, as described above, the conductive protective film 235 should be formed to have a thickness of 3 μm or greater to prevent the light-leakage and the static electricity. The thickness of the conductive protective film 235 included in the display device according to an aspect of the present disclosure may be in a range of 3 μm inclusive to 4.5 μm inclusive.

Although the pad printing scheme for forming the conductive protective film 235 is mentioned above with reference to FIG. 9, the present disclosure is not limited thereto, and other schemes such as a deposition scheme and a dotting scheme may be used.

A display device according to the aspects of the present disclosure may be described as follows.

A first aspect of the present disclosure provides a display device comprising: a first substrate on which a plurality of light-emitting elements are disposed; an optical film disposed on one surface of the first substrate, wherein the optical film includes an upper surface, a side surface, and a lower surface; a second substrate bonded to the other surface of the first substrate; a side surface line electrically connecting the first substrate and the second substrate to each other; a side surface sealing member covering the side surface line; and a conductive protective film covering an outer surface of each of the side surface sealing member and the optical film.

According to one feature of the display device of the present disclosure, the display device further comprises a side surface line protective film disposed between the side surface line and the side surface sealing member.

According to one feature of the display device of the present disclosure, the conductive protective film covers an upper surface and a side surface of the optical film.

According to one feature of the display device of the present disclosure, a width of a portion of the conductive protective film disposed on the upper surface of the optical film is 100 μm or smaller.

According to one feature of the display device of the present disclosure, the conductive protective film includes carbon black particles, or includes metal particles and a black material.

According to one feature of the display device of the present disclosure, the light-emitting element is a micro-LED.

According to one feature of the display device of the present disclosure, the display device further comprises: a first planarization layer surrounding a side surface of the light-emitting element; a bank disposed on the first planarization layer, wherein a vertical level of an upper surface of the bank is higher than a vertical level of an upper surface of the light-emitting element; and a protective layer disposed on the first planarization layer, the bank, and the light-emitting element.

According to one feature of the display device of the present disclosure, a lower surface of the optical film is in contact with the protective layer and the side surface sealing member.

According to one feature of the display device of the present disclosure, the protective layer covers a side surface of the first planarization layer and a side surface of the bank.

According to one feature of the display device of the present disclosure, a first pad electrode is disposed on an outermost area of one surface of the first substrate, wherein a second pad electrode is disposed on an outermost area of one surface of the second substrate, wherein the side surface line overlaps with the first pad electrode and the second pad electrode.

According to one feature of the display device of the present disclosure, the display device further comprises a data line, a gate line, and a power line disposed on one surface of the first substrate, wherein the first pad electrode is connected to one of the data line, the gate line, and the power line.

According to one feature of the display device of the present disclosure, the power line is electrically connected to the light-emitting element.

According to one feature of the display device of the present disclosure, the display device further comprises an auxiliary power line disposed on one surface of the second substrate, wherein the second pad electrode is connected to the auxiliary power line.

According to one feature of the display device of the present disclosure, the auxiliary power line is electrically connected to the power line.

According to one feature of the display device of the present disclosure, the optical film includes a base optical film and an adhesive optical film.

According to one feature of the display device of the present disclosure, the optical film includes one of an anti-scattering film, an anti-glare film, an anti-reflection film, a low-reflection film, and a luminance enhancement film.

According to one feature of the display device of the present disclosure, the display device further comprises a transistor disposed on one surface of the first substrate, wherein the transistor includes a source electrode, a drain electrode, an active layer, and a gate electrode, wherein the source electrode or the drain electrode is connected to the light-emitting element.

According to one feature of the display device of the present disclosure, the display device further comprises: a passivation layer covering the transistor; and an adhesive layer disposed between the passivation layer and the light-emitting element.

According to one feature of the display device of the present disclosure, the display device further comprises a bonding layer disposed between the first substrate and the second substrate.

A second aspect of the present disclosure provides a tiling display apparatus comprising: a plurality of display devices, wherein each of the plurality of display devices includes the display device of the first aspect, wherein the plurality of display devices are arranged so that the conductive protective films of adjacent ones of the plurality of display devices are adjacent to each other.

It will be apparent to those skilled in the art that various modifications and variations can be made in the display device and the tiling display apparatus including the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:
- a first substrate on which a plurality of light-emitting elements are disposed;
- an optical film disposed on one surface of the first substrate;
- a second substrate bonded to another surface of the first substrate;
- a side surface line electrically connecting the first substrate and the second substrate;
- a side surface sealing member covering the side surface line; and
- a conductive protective film covering the side surface sealing member and the optical film.

2. The display device of claim 1, further comprising a side surface line protective film disposed between the side surface line and the side surface sealing member.

3. The display device of claim 1, wherein the conductive protective film covers an upper surface and a side surface of the optical film.

4. The display device of claim 3, wherein the conductive protective film disposed on the upper surface of the optical film has a width of 100 μm or smaller.

5. The display device of claim 3, wherein the conductive protective film includes carbon black particles or includes metal particles and a black material.

6. The display device of claim 1, wherein the light-emitting element includes a micro-LED.

7. The display device of claim 1, further comprising:
- a first planarization layer surrounding a side surface of the light-emitting element;
- a bank disposed on the first planarization layer, wherein a vertical level of an upper surface of the bank is higher than a vertical level of an upper surface of the light-emitting element; and
- a protective layer disposed on the first planarization layer, the bank, and the light-emitting element.

8. The display device of claim 7, wherein the optical film has a lower surface in contact with the protective layer and the side surface sealing member.

9. The display device of claim 7, wherein the protective layer covers a side surface of the first planarization layer and a side surface of the bank.

10. The display device of claim 1, further comprising;

a first pad electrode disposed on an outermost area of one surface of the first substrate; and a second pad electrode disposed on an outermost area of one surface of the second substrate, wherein the side surface line overlaps with the first pad electrode and the second pad electrode.

11. The display device of claim 10, further comprising a data line, a gate line, and a power line disposed on one surface of the first substrate, wherein the first pad electrode is connected to one of the data line, the gate line, and the power line.

12. The display device of claim 11, wherein the power line is electrically connected to the light-emitting element.

13. The display device of claim 10, further comprising an auxiliary power line disposed on one surface of the second substrate, wherein the second pad electrode is connected to the auxiliary power line.

14. The display device of claim 13, wherein the auxiliary power line is electrically connected to the power line.

15. The display device of claim 1, wherein the optical film includes a base optical film and an adhesive optical film.

16. The display device of claim 15, wherein the optical film includes one of an anti-scattering film, an anti-glare film, an anti-reflection film, a low-reflection film, and a luminance enhancement film.

17. The display device of claim 1, further comprising a transistor disposed on one surface of the first substrate, wherein the transistor includes a source electrode, a drain electrode, an active layer, and a gate electrode, and wherein the source electrode or the drain electrode is connected to the light-emitting element.

18. The display device of claim 17, further comprising:

a passivation layer covering the transistor; and an adhesive layer disposed between the passivation layer and the light-emitting element.

19. The display device of claim 1, further comprising a bonding layer disposed between the first substrate and the second substrate.

20. A tiling display apparatus comprising:

a plurality of display devices, wherein each of the plurality of display devices includes the display device according to claim 1, wherein the conductive protective films of adjacent ones of the plurality of display devices are adjacent to one another.

21. A display device comprising:

a first substrate having an inclined surface and a side surface;

a second substrate bonded to the first substrate and having an inclined surface and a side surface;

a plurality of light-emitting elements disposed on the first substrate;

an optical film disposed over the plurality of light-emitting elements;

a first pad electrode disposed on the first substrate;

a second pad electrode disposed on the second substrate;

a side surface line disposed on the first and second pad electrodes and covering the side surfaces of the first and second substrates;

a side surface sealing member covering the side surface line; and a conductive protective film covering the side surface sealing member and the optical film.

22. The display device of claim 21, further comprising a side surface line protective film disposed between the side surface line and the side surface sealing member.

23. The display device of claim 21, wherein the conductive protective film covers an upper surface and a side surface of the optical film.

24. The display device of claim 23, wherein the conductive protective film disposed on the upper surface of the optical film has a width of 100 μm or smaller.

25. The display device of claim 23, wherein the conductive protective film includes carbon black particles or includes metal particles and a black material.

* * * * *